United States Patent
Geske

(10) Patent No.: US 10,367,407 B2
(45) Date of Patent: Jul. 30, 2019

(54) METHOD AND DEVICE FOR CONTROLLING A VOLTAGE-CONTROLLED POWER SEMICONDUCTOR SWITCH THAT CAN BE SWITCHED OFF AGAIN

(71) Applicant: GE Energy Power Conversion Technology Limited, Rugby, Warwickshire (GB)

(72) Inventor: Martin Geske, Berlin (DE)

(73) Assignee: GE ENERGY POWER CONVERSION TECHNOLOGY LTD, Warwickshire (GB)

(*) Notice: Subject to any disclaimer, the term of this patent is extended or adjusted under 35 U.S.C. 154(b) by 0 days.

(21) Appl. No.: 15/665,684

(22) Filed: Aug. 1, 2017

(65) Prior Publication Data
US 2018/0034358 A1 Feb. 1, 2018

(30) Foreign Application Priority Data
Aug. 1, 2016 (EP) .................................. 16182132

(51) Int. Cl.
*H02M 1/08* (2006.01)
*H03K 17/18* (2006.01)
(Continued)

(52) U.S. Cl.
CPC ............ *H02M 1/08* (2013.01); *H02M 7/483* (2013.01); *H02M 7/757* (2013.01); *H02M 7/797* (2013.01);
(Continued)

(58) Field of Classification Search
CPC ............ H02M 1/08; H02M 2001/0054; H03K 17/165; H03K 17/168; H03K 17/18
(Continued)

(56) References Cited

U.S. PATENT DOCUMENTS 6,097,582 A * 8/2000 John .................... H03K 17/165
361/79
7,724,065 B2 5/2010 Bayerer et al.
(Continued)

FOREIGN PATENT DOCUMENTS

DE 10 2010 006 525 A1 8/2011
DE 102011003733 A1 8/2012
(Continued)

OTHER PUBLICATIONS

European Search Report issued in connection with corresponding EP application No. 16182132.7 dated Jan. 24, 2017.
(Continued)

*Primary Examiner* — William Hernandez
(74) *Attorney, Agent, or Firm* — Wood IP LLC

(57) ABSTRACT

A method and a device for controlling a voltage-controlled power semiconductor switch that can be switched off again, which has a first and a second connection and a control connection and which is conductive in the switched on state between the first and the second connection is provided. Firstly, a first control voltage comprising a first value is applied to the control connection to switch on the power semiconductor switch. Subsequently, conditions are detected, which indicate the progress of the switch-on procedure of the power semiconductor switch. As soon as conditions are detected, which are indicative of the fact that the switch-on procedure is deemed to be complete, a second control voltage comprising a second value higher than the first value is applied to the control connection to operate the power semiconductor switch in the conductive state with a higher control voltage to reduce its conduction losses.

19 Claims, 6 Drawing Sheets

(51) Int. Cl.
*H02M 7/757* (2006.01)
*H02M 7/797* (2006.01)
*H03K 17/16* (2006.01)
*H02M 7/483* (2007.01)
*H02M 1/00* (2006.01)

(52) U.S. Cl.
CPC ......... *H03K 17/165* (2013.01); *H03K 17/168* (2013.01); *H03K 17/18* (2013.01); *H02M 2001/0054* (2013.01); *H02M 2007/4835* (2013.01); *Y02B 70/1491* (2013.01)

(58) Field of Classification Search
USPC ...... 326/82, 83, 89; 327/108, 109, 419, 427, 327/432, 434, 478, 574, 581
See application file for complete search history.

(56) References Cited

U.S. PATENT DOCUMENTS

| | | | |
|---|---|---|---|
| 8,503,146 B1* | 8/2013 | Shekhawat | ........ H03K 17/0812 361/93.9 |
| 2005/0253165 A1 | 11/2005 | Pace et al. | |
| 2011/0002073 A1 | 1/2011 | Fukuda et al. | |
| 2011/0188162 A1 | 8/2011 | Wetter et al. | |
| 2013/0301326 A1* | 11/2013 | Zoels | ................. H01L 27/0248 363/132 |
| 2014/0253184 A1* | 9/2014 | Yamauchi | ........ H03K 17/08128 327/109 |
| 2017/0264284 A1* | 9/2017 | Xu | ................. B60L 11/1803 |
| 2017/0327001 A1* | 11/2017 | Lu | ................. B60L 3/003 |

FOREIGN PATENT DOCUMENTS

| | | |
|---|---|---|
| EP | 2 747 260 A2 | 6/2014 |
| EP | 2 768 140 A1 | 8/2014 |
| WO | 2015024754 A1 | 2/2015 |

OTHER PUBLICATIONS

Dulau, L., et al., "A New Gate Driver Integrated Circuit for IGBT Devices with Advanced Protections," IEEE Transactions on Power Electronics, vol. 21, No. 1, pp. 38-44 (Jan. 2006).

Grbovic, P. J., "An IGBT Gate Driver for Feed-Forward Control of Turn-on Losses and Reverse Recovery Current," IEEE Transactions on Power Electronics, vol. 23, No. 2, pp. 643-652 (Mar. 2008).

Lobsinger, Y., and Kolar, J. W., "Closed-Loop dii/d tt and d vv/dtt IGBT Gate Driver Concepts," ECPE Turorial, pp. 1-64 (2013).

Yang, X., et al., "Robust Stability Analysis of Active Voltage Control for High-power IGBT Switching by Kharitonov's Theorem," IEEE transactions on power electronics, vol. 31, No. 3, pp. 2584-2595 (Mar. 2016).

Extended European Search Report and Opinion issued in connection with corresponding EP Application No. 16182132.7 dated May 26, 2017.

* cited by examiner

METHOD AND DEVICE FOR CONTROLLING A VOLTAGE-CONTROLLED POWER SEMICONDUCTOR SWITCH THAT CAN BE SWITCHED OFF AGAIN

FIELD OF INVENTION

The present invention relates to a method and device for controlling a power semiconductor switch that can be switched off again. In particular, the invention relates to a method and a device for controlling a voltage-controlled power semiconductor switch that can be switched off again in order to reduce losses during operation and to improve its thermal behavior.

BACKGROUND OF THE INVENTION

Power semiconductor devices such as IGBTs (Insulated Gate Bipolar Transistors), BIGTs (Bi-mode Insulated Gate Transistors), MOSFETs (Metal Oxide Semiconductor Field Effect Transistors), IGCTs (Integrated Gate Commutated Thyristors), and the like, are used—among other things—for rectification and inversion of electrical voltages and currents. Usually suitable converters comprise a plurality of power semiconductor switches. Converters are known in different topologies and for different applications for coupling electrical grids with variable-speed drives, for compensating purposes, for energy exchange between two electrical grids, etc. for different power levels.

With continuous development of power semiconductor switches, ever newer converters and circuit topologies are desired and developed for ever higher power and voltage ranges. In the medium and high-voltage range, for example, use is made of converters which have a multiplicity of power semiconductor switches arranged in series and/or parallel to one another or submodules formed thereof in the form of half, full bridges, or the like. Thus, high blocking capability and high current carrying capacity can be provided for the particular application, and the voltages can be increased to the highest levels up to high-voltage direct-current (HVDC) transmission. In the case of the classic 2- and 3-level converters, a higher power density is of interest, which can be achieved by compact design in conjunction with low-loss power semiconductors by means of suitable control and an optimal converter configuration and appropriate cooling.

Semiconductor devices generate in operation essentially conduction and switching losses. Depending on the particular application, the reduction of semiconductor losses is necessary in order to be able to reduce the thermal design requirements or achieve higher system efficiencies. In application fields of grid operation such as, for example, the compensation systems or, for example, the so-called Static Synchronous Compensators (STATCOM), which are pulse-operated converters, which generate a three-phase voltage system with variable voltage amplitude and a phase shift of 90° towards the conduction currents, the HVDC or pumped storage power stations, low converter losses are extremely important. Losses are often assessed here by cost factors in order to account for the corresponding system losses over a period of time (e.g. the service life of a converter) in the system or converter price. In this respect, it is extremely important to reduce losses to a minimum. In addition, it is also advantageous to reduce the losses for rarely occurring operating points with a high load in different applications to a minimum in order to avoid the need for a generally oversized cooling design for these points.

By optimized pulse patterns and system designs it is possible to reduce switching losses and switching frequency to a minimum. Some known methods are aimed at influencing the switching transients when switching on and off power semiconductor switches in order to reduce the switching losses. For example, Laurent Dulau, et al. describes in "A New Gate Driver Integrated Circuit for IGBT Devices with Advanced Protections", IEEE Transactions on Power Electronics, Vol. 21, No. 1, January 2006, an integrated circuit of a control device (a gate driver) for an IGBT switch, which provides a two-stage switching on and off of the IGBT in order to reduce the reverse current peak from the commutating diode when the IGBT is switched on or to decrease the switch-off overvoltage during shutdown of the IGBT. By increasing the gate voltage to an intermediate level, which is slightly above the IGBT threshold voltage, for a short time before the IGBT is finally turned on, the IGBT collector current and its collector current rise $di_c/dt$ can be limited, thus the switching losses can additionally be optimized, taking into account the safe operating area (SOA) of the power semiconductor. Also, by reducing the gate voltage to an intermediate level, which is slightly above the IGBT threshold voltage, for a short time before the IGBT is finally switched off, the collector current drop is limited and thus the possible switch-off overvoltage is reduced, which can also reduce the switch-off losses during the switch-off operation. In applications where a multiplicity of high-frequency power semiconductor switches is switched, for example, in the kHz range, this can substantially reduce the total losses during operation.

U.S. Pat. No. 7,724,065 B2 describes a gate drive circuit, which allows desaturation of an IGBT in the conductive state shortly before it is switched off. As a result, the switching transients can be improved during switch-off, the switch-off losses during desaturation with optimized duration before switch-off can be reduced and, as the circumstances require, the switch-off overvoltage can be reduced.

It has also been proposed to control or regulate the rate of change of the collector current $di_c/dt$ and the rate of change of the collector emitter voltage $du_{CE}/dt$ of an IGBT during a changeover procedure in order to minimize switching losses by optimizing the switching transients. Switching losses can be reduced even further by optimizing the gate resistances $R_{Gon}$ or $R_{Goff}$ taking into account the limits of the safe operating area of an IGBT and its commutating diode. All these methods are aimed at the optimization of the switch events or transitions.

In addition, it is possible to reduce conduction losses of the semiconductor devices in the conductive state. This can be done, for example, by the physical construction of the component or by appropriate operating conditions. The conduction losses of an IGBT are usually lower during operation with a reduced junction temperature and can be reduced by efficient cooling. However, the latter increases the space required for the components and cooling systems. Power semiconductor switches with low forward voltage, so-called low VCE(sat) transistors, can also be used, but can increase the cost of implementing or entail other disadvantages such as, for example, increased switching losses. There is the desire to reduce the conduction losses in general or depending on the operating point of the converter, because together with the switching losses they account for the total loss of power semiconductor switches and devices formed thereof, e.g. converters.

The required semiconductor surface and size as well as the associated implementation and operating costs are another important aspect relating to the application of power semiconductor switches. For example, modern converters, which are made with IGBTs, are manufactured from the point of view of safe operating area limits of the IGBTs as well as the thermal limits of the IGBTs, which are determined by the transient and static thermal resistances, the load, the electrical operating point and cooling aspects. For certain critical situations, such as short-term overload or surge currents, the thermal load limits of the IGBTs could be exceeded. A safe thermal design of IGBT for these rare events would lead to a costly oversizing of IGBTs, its cooling device and the converter.

From DE 10 2010 006 525 and EP 2 747 260 A2 it is known that semiconductor devices, which can be switched off again, especially IGBTs, can briefly operate outside of the specified parameters, to allow a desaturation for avoidance and high load currents. DE 10 2010 006 525 B4 describes a device for diverting surge currents or transient overvoltages, for example as a result of a lightning strike with a semiconductor switch that can be switched off again, where the switch-on is achieved by applying a static gate emitter voltage outside of the range specified for its gate emitter voltage for continuous operation. Usually, IGBTs in the switched on state are operated at 15 V, whereby according to the specification of the manufacturers the gate emitter voltage for continuous operation should typically not exceed 20 V, because otherwise the insulating oxide layer of the gates will lose much of its service life and as a result it can be destroyed significantly earlier than anticipated, which destroys the IGBT as a consequence. For the short-term or transient surge currents as a result of lightning strikes an increased gate emitter voltage of, for example, 30 V-50 V is proposed. The switching element is switched off again after the short-term or transient surge current has decayed.

EP 2 747 260 A2 describes a three-phase converter with IGBTs as power semiconductor switches, whereby in the event that conditions are detected, which indicate a load short circuit, the gate emitter voltage of at least one power semiconductor switch is increased from a value in the normal operating mode, for example of 15 V, to a higher value. The higher value can be also in a range between about 30 V and about 70 V, outside of the permissible range. With the resulting increase of the branch currents in the fault-free branches, the motor can achieve a balancing of the short-circuit currents and oscillating torques in the motor can be avoided.

BRIEF DESCRIPTION OF THE INVENTION

On this basis, it is a task of an embodiment of the present invention to create a method and a device for controlling a voltage-controlled power semiconductor switch that can be switched off again, which are set up to reduce losses of the semiconductor switch in operation. In particular, it is a task of embodiments of the present invention to propose measures to reduce conduction losses of power semiconductor switches during the conductive or the switched on state and thus total losses of devices built with a multiplicity of such power semiconductor switches, especially converters, without increasing the costs for the implementation and the operation of the power semiconductor switches and the devices, the semiconductor surface and size for the semiconductor switches, their cooling device, etc.

This task is solved by a method for controlling a voltage-controlled power semiconductor switch that can be switched off again, having the characteristics of claim 1, a device for controlling a voltage-controlled power semiconductor switch that can be switched off again according to claim 15, a converter according to claim 18 and a data storage device according to claim 19.

According to an aspect of the invention, a method for controlling a voltage-controlled power semiconductor switch that can be switched off again is created, which comprises a first and a second connection as well as a control connection, which in the switched on state is conductive between the first and the second connection. The method comprises an application of a first control voltage, which comprises a first value, on the control connection to switch on the power semiconductor switch. The method further comprises a detection of conditions that mark the progress of a switch-on procedure of the power semiconductor switch. The procedure further comprises an application of a second control voltage, which comprises a second value that is higher than the first value, on the control connection to operate the power semiconductor switch in the conductive state, if conditions are detected, which are indicative of the fact that the switch-on procedure is deemed to be complete.

An embodiment of the invention aims to reduce conduction losses of power semiconductor switches, especially IGBTs, MOSFETs or other aforementioned power semiconductor switches, in operation on the basis of the control. This is achieved in a way in which the switching operation itself is not modified. Only after the switch-on occurred and is completed or the power semiconductor switch is switched on, its control voltage is appropriately increased, for example the gate voltage of an IGBT. This has the advantage that the commutation and switching behavior as such remain unchanged, in an embodiment. In addition, a direct switch-on or switch-off with increased control voltage could negatively affect the load current transients and cause additional higher switching losses. Furthermore, a direct switch-on with a higher control voltage would affect the switching speed, with the result that the switch-off overvoltage increases, the reverse current peak of a power semiconductor associated diode, which forms with the power semiconductor switch a commutation pair, increases and possibly faster rise times of the semiconductors cause additional electro-magnetic interference or parasitic effects occur. For the reasons first mentioned, as the case may be, the safe working range or the safe operating area (SOA) of semiconductors can be exceeded. This can be avoided through the switch-on with a first control voltage within the normal range of 10-15 volts in the case of an IGBT or a MOSFET. In addition, the already provided for short-circuit protection measures, which normally become active immediately after the switch-on procedure, can still be used without increased control voltage, in particular the monitoring of the short circuit 1, without any further adjustment. The type "short circuit 1" is characterized by a direct switch-on of an IGBT upon a short circuit. With appropriate monitoring of the short circuit 1 it is checked directly after the switch-on if a short circuit exists, which already existed before the switch-on of the power semiconductor switch. In an embodiment, the monitoring of short circuit 1 can remain unchanged directly after the switch-on at the appropriate desaturation thresholds for the standard control voltage. The switchover to the increased, second positive level of the control voltage occurs only after the completed monitoring of short circuit 1.

If conditions are detected, which are indicative of the fact that the switch-on procedure is deemed to be complete or the power semiconductor switch is switched on, a higher second control voltage can be applied (if necessary, after completed monitoring of short circuit 1) to the control connection of the power semiconductor switch, according to an embodiment.

The increased control voltage increases the voltage saturation range, since the so-called "pinch-off", i.e. the constriction of the conductive channel below the gate, only begins at higher currents and the conductivity of the channel is increased. The forward voltage and the conduction losses in the conductive operation are thereby reduced for the power semiconductor switch. Furthermore, the junction temperature of the power semiconductor switch is thereby also reduced in comparison with a lower control voltage in conductive operation. Each power semiconductor switch itself and a converter built with a multiplicity of such power semiconductor switches can carry higher currents or assume the same overload for a longer time. The improvement of the thermal behavior of the power semiconductor switches by the method according to an embodiment also entails lower costs for the associated cooling system, including heat sinks, means for circulating a cooling fluid, etc., as well as a reduction in semiconductor costs. A lesser oversizing of the power semiconductor switches is necessary in order to handle short-term overload conditions.

Without wanting to be committed to the values, it is estimated that a reduction in the conduction losses of a power semiconductor switch of up to 10% or even more could be achieved. This could result in a correspondingly higher performance of a modular multilevel converter in the inverter mode with a low switching frequency in the range of 100 to 150 Hz with the same thermal stress. Thus, the same converter can increase its rated output power for overload or other critical situations or can handle the same overload conditions over an extended period of time.

The increased value of the second control voltage can be, for example, 15-20 V. In preferred embodiments it can be at about 17-18 volts. Provision is also made for applications in which the second control voltage is higher than the range specified for the continuous operation of the power semiconductor switch, in particular higher than 20 V for an IGBT or a MOSFET. For example, it can be at 30 V or more. The conduction losses are then further reduced or even higher currents due to faults in the grid or overload demands are handled.

In general, the application of the first control voltage can take place in response to the receipt of a control signal from a higher-level control device. The control signal can represent the target state of the power semiconductor switch, as specified by the higher-level control device. The downstream control device, for example a semiconductor gate drive circuit, ensures the appropriate control of the power semiconductor switch during switch-on and in the conductive state of the same according to an embodiment of the method.

In some embodiments, the detection of conditions, which indicate the progress of a switch-on process of the power semiconductor switch can comprise a detection of at least one operating parameter on the power semiconductor switch, whereby the operating parameters comprise at least one voltage potential, for example, the potential at the collector (drain), at the emitter (source) or at the gate connection in the case of an IGBT (MOSFET) and/or the load current (collector current, drain current) through the power semiconductor switch. Alternatively or additionally, the period of time since the application of the first control voltage to the control connection can be detected.

In an embodiment of any one of the aforementioned methods, the detection of conditions, which are indicative of the fact that the switch-on procedure is deemed to be complete is based on a time recording in which the expiry of a period of time $t_{th} = t_{d(on)} + t_r + t_{add}$ since the time of the application of the first control voltage is detected. Here, $t_{d(on)}$ is the switch-on delay, which is the delay between the switch-on at the control electrode (here, in particular, defined at 10% of the positive gate voltage) until 10% of the load current, e.g. the collector current or the drain current, is reached, whereas $t_r$ is the rise time of the current through the power semiconductor switch. These parameters are specified for the respective power semiconductor switch type in associated data sheets or can be determined by measurement for differing conditions with respect to voltage, commutation circuit inductance, junction temperature for corresponding gate resistances and control. $t_{add}$ is an additional time which in particular takes into account the gate drive type dependent period of time between the application of the gate voltage or control voltage and the time of reaching 10% of the collector or drain current and can further take into account that during and shortly after switch-on short-circuit protection monitoring and measures can be carried out that require a certain period of time. In general, this additional time constant $t_{add}$ is in the range of 0-20 microseconds. It is between 5-15 microseconds. As needed, $t_{add}$ can also be more than 15 microseconds. Thus, a total period of time $t_{th}$ is waited for since the switch-on of the power semiconductor switch, which is at least 25 microseconds or even more than 30 or 35 microseconds depending on the semiconductor device and such that the monitoring of the short circuit 1 is completed.

In an alternative of a method according to an embodiment the detection of conditions, which are indicative of the fact that the switch-on procedure is deemed to be complete, can show that a short circuit monitoring is complete, where it is checked if a direct switch-on based on a short circuit (short circuit 1) exists, whereby a second control voltage is applied, if it is established that no short circuit 1 exists. The completion of the monitoring of the short circuit 1 itself thus triggers the switchover of the control voltage to the second level. A short circuit 1 can be detected, for example, by monitoring the collector emitter voltage or the forward voltage, the rates of change of collector current and/or collector emitter voltage, the control voltage and/or the current through the power semiconductor switch. The monitoring for the short circuit 1 type generally takes a maximum of 15 microseconds.

According to yet further embodiments, the detection of conditions, which are indicative of the fact that the switch-on procedure is deemed to be complete, can comprise that it is detected that the voltage on the control circuit (e.g. the gate voltage) reaches or exceeds a third threshold value that is higher than a value of the Miller plateau of the control voltage. When switching on an IGBT or MOSFET, the voltage at the gate first rises to a range called the "Miller plateau", where the voltage remains more or less constant for a short time, even though charge carriers continue to flow to the control electrode (the gate). These charge carriers are used during this phase for charge reversal of gate collector or gate drain capacitance. After passing through the Miller plateau, the gate voltage will rise to its final value. The passing through and exiting of the Miller plateau of the gate voltage can be detected and used as a criterion for the application of the second control voltage.

The third threshold value can be at least 90% of the value of the first control voltage. It is at least 95% of the value of the first control voltage.

In other embodiments the detection of conditions, which are indicative of the fact that the switch-on procedure is deemed to be complete, can comprise that it is detected that the forward voltage, for example the collector emitter voltage (drain-source voltage) of IGBTs (MOSFETs), between the first and the second connection reaches or drops below a second threshold value that is indicative of the fact that the power semiconductor switch is switched on. After the switch-on, the collector emitter voltage drops to a final value of the forward voltage or $U_{CEsat}$ appropriate for the current and the temperature. A suitable second threshold value detects that the collector emitter voltage has fallen to a typical value for the conductive operation and the power semiconductor switch is fully switched on. In an embodiment this threshold value is slightly above the maximum anticipated forward voltage, which can be determined by the measurement for different currents and temperatures and, if necessary, by taking into account the dispersion of the semiconductor devices with a safety margin.

The second threshold value for the forward voltage can be, for example, in the range of 10 V to 0.5 V., it is less than 5 V.

In still further embodiments the detection of conditions, which are indicative of the fact that the switch-on procedure is deemed to be complete, can comprise the detection that the current flowing between the first and second connection, for example the collector or drain current, has passed through a current peak that corresponds to a reverse current peak that occurred when switching on the semiconductor switch, which commutes by means of the reverse recovery effect from the diode to the power semiconductor switch. It is checked that after passing through the reverse current peak, the current has again fallen below a first threshold value, where the rate of change $dI_C/dt$ of the current through the power semiconductor switch is in the amount less than 20%, less than 10% of the current increase from 10% to 90% of the current $I_C$ when switching on the power semiconductor switch. If these conditions are met, the power semiconductor switch can be considered as switched on and the second, higher control voltage can be applied.

In a further development of any aforementioned method after the detection of the conditions, which are indicative of the fact that the switch-on procedure is deemed to be complete, it can be checked if overload conditions exist, where the second control voltage is applied only, if it is determined that overload conditions exist. Overload conditions can be checked, for example, on the basis of the forward voltage or of the collector current. Overload conditions can exist, for example, if the forward voltage or the collector current exceeds or exceed a predetermined fourth threshold value, which is greater than the second threshold value or the nominal current of the semiconductor device. The overload condition for the collector current is, for example, in the range of the nominal current of the power semiconductor switch, but can be also up to the double value of the nominal current depending on the application.

In particularly preferred embodiments of any aforementioned methods, the voltage applied to the control electrode of the power semiconductor switch can be regulated to the second value of the second control voltage in a closed control loop. In the course of this, the measured forward voltage on the power semiconductor switch or the measured current through it can be used to form the measured value for the feedback for the control loop. A direct control can adapt the forward voltage with given current in relation to its height and/or the collector emitter saturation voltage in a targeted manner. The control can occur with an analog circuit or by digital means, for example, on the basis of a field programmable gate array (FPGA). Alternatively, a simple control of the control voltage can be performed.

According to an further development of any aforementioned methods, to switch off the power semiconductor switch, first a control voltage can be applied at the control connection, which is less than the second control voltage and can, for example, roughly correspond to the first control voltage, while with expiry of a predetermined period of time a voltage is applied, which is appropriate to a safe switch-off of the power semiconductor switch. The switch-off occurs then in two steps, whereby the increased control voltage is switched off again with an appropriate lead time prior to the actual switch-off in order to reach the gate voltage normally intended for the switch-off and switching operation. If the corresponding gate voltage is reached, the power semiconductor switch can be switched off, for example, with a negative gate voltage of −5 V to −15 V. It is also possible to switch off the power semiconductor switch directly from the increased control voltage.

According to a further aspect of the invention, a device for controlling a voltage-controlled power semiconductor switch that can be switched off again is created, which comprises a first and a second connection as well as a control connection, in particular of an IGBT or a MOSFET, whereby the power semiconductor switch in the switched on state is conductive between the first and the second connection. The device is configured to perform the method as described above.

The device, which for example can be referred to as gate drive, is arranged in a circuit in the immediate vicinity of the power semiconductor switch. It enables the control of the corresponding power semiconductor switch(es) according to an embodiment of the method in order to reduce its conduction losses in the operation. The device according to an embodiment can realize this by itself, without intervention in the higher-level control.

In particular, the control device according to an embodiment can comprise a drive device, which is configured to receive ON/OFF control commands from a higher-level control that mark the target state of the power semiconductor switch and generate control voltages for the power semiconductor switch according to an embodiment of the method. The device can further comprise a detection device for detection of at least one operating parameter on the power semiconductor switch, whereby the operating parameters can comprise at least one voltage potential at one of the connections of the power semiconductor switch and/or the current through the power semiconductor switch. In addition or alternatively, the device can comprise a time control device for detection of the period of time since the application of the first control voltage on the control connection. In addition, the control device can contain an evaluation device, which compares the parameters or time values with threshold values and instructs the drive circuit based thereon to generate the appropriate control voltage and to apply it at the gate of the power semiconductor.

In a particularly preferred embodiment the control device according to an embodiment can also comprise a regulating device for regulating the voltage applied to the control electrode of the power semiconductor switch to the second value of the control voltage in a closed control loop, using the measured voltage on the power semiconductor switches or the measured current through this as a measured and regulating variable, while the power semiconductor switch is conductive (fully switched on).

In addition, with regards to the embodiments and the further developments of the control device and their advantages according to an embodiment, reference is made to the above explanations to the method according to an embodiment which apply mutatis mutandis.

In still another aspect of the invention, a converter with a multiplicity of power semiconductor switches is created to convert alternating current into direct current and vice versa, whereby a device according to one of the claims of 16 to 18 is assigned to the power semiconductor switches individually or in groups. The converter benefits from advantages already mentioned in connection with the control methods and control devices according to an embodiment.

In still another aspect, a data storage device is created, which comprises computer readable instructions to execute the above-described method. An embodiment can thus be embodied in the form of computer readable instructions for controlling a programmable computer or another programmable computing device in such a way that the instructions, if they are performed by the computer or computing devices, perform the above described control methods according to an embodiment. Such instructions can be implemented in the form of a computer program product with a computer readable medium that stores the instructions. In particular, the instructions can be loaded into a FPGA or a microcontroller in a control device (e.g. a gate drive), which is intended to provide the control voltage for the power semiconductor switches.

BRIEF DESCRIPTION OF THE DRAWINGS

Further advantageous details of embodiments result from the subordinate claims, the drawing and the associated description. Embodiments of the invention are described in more detail below by reference to a drawing, which shows exemplary, non-limiting embodiments of the invention, wherein the same reference numerals are used in all figures to indicate the same elements. The drawings in detail:

DETAILED DESCRIPTION

Figure 1:
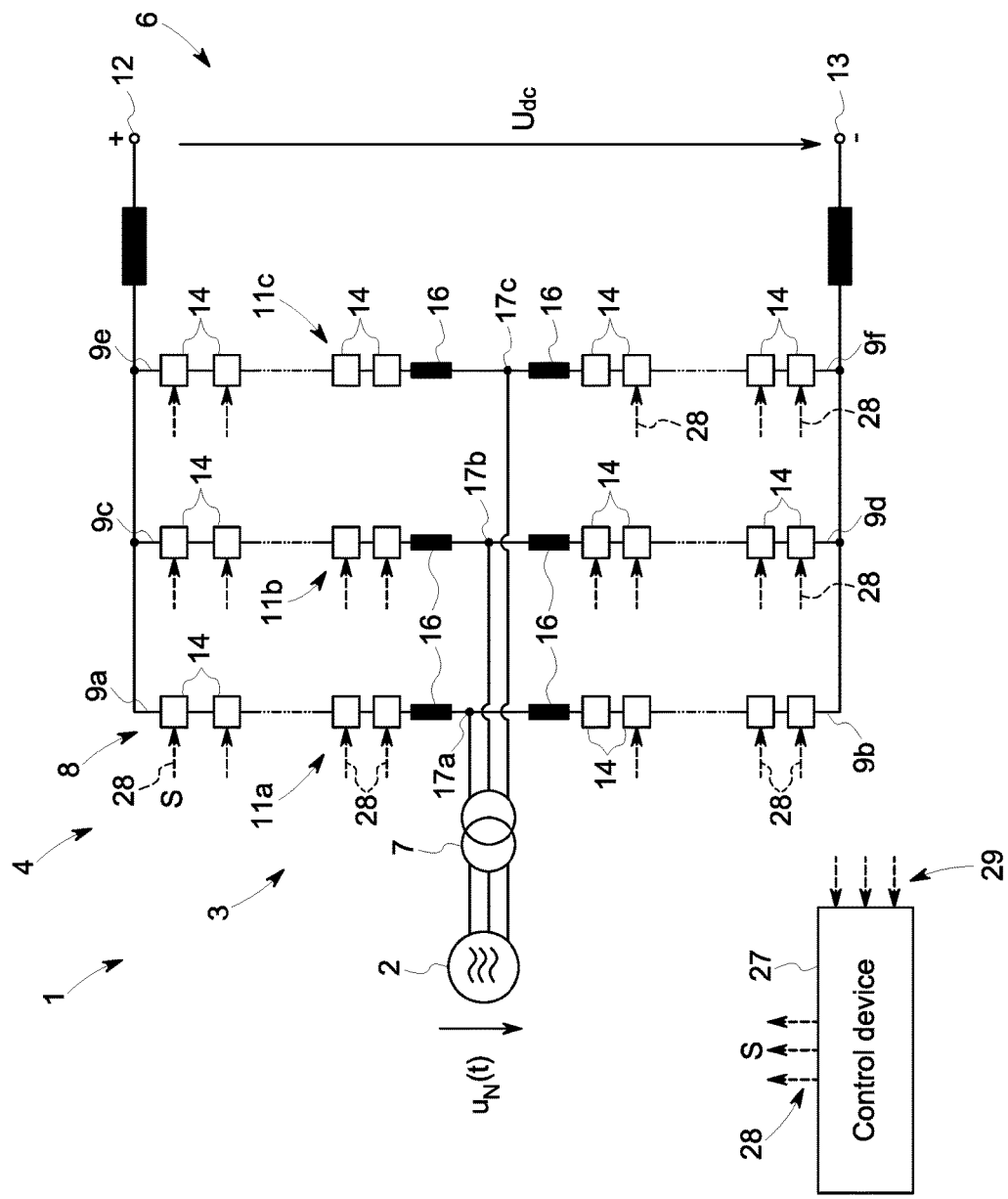
FIG. 1 shows an exemplary system with a modular multilevel converter, built from a plurality of submodules, for coupling a power grid of an electric motor or another AC voltage source with another grid or a load to illustrate an exemplary application of the invention in the form of a simplified block diagram.

FIG. 1 shows in a simplified representation a system 1, which is suitable for a high-voltage direct current power distribution system for the electrical energy transmission with high DC voltage, or for many other applications. The system 1 comprises here, for example, a three-phase AC voltage source 2, which can, for example, be an electric power grid, an electrical alternating current (AC) machine, an AC generator, a wind power plant or the like. An electrical converter 4 is connected to the AC voltage source 2 with its AC side 3, whose DC side 6 can be connected via a direct current transmission device to another power grid, not shown here. The connection of the converter 4 to the AC voltage source 2 can occur optionally via a transformer 7.

The converter 4 comprises at least a first converter 8, which can be a rectifier to convert an alternating voltage $u_N(t)$ of the AC voltage source 2 to a direct voltage $U_{dc}$ on the output side. Optionally, the converter 4 might comprise a further converter, not shown here, which converts the voltage $U_{dc}$ to a suitable alternating voltage for another grid or an electric drive or is connected in parallel to the first converter 8. It is understood that the functions of the converters reverse if the flow of energy occurs reverse to the power grid or the voltage sink 2.

As can be seen from FIG. 1, the converter 8 here comprises six converter branches 9a-9f, of which each two, an upper and a lower 9a, 9b or 9c, 9d or 9e, 9f form a respective phase branch 11a, 11b or 11c. Each phase branch 11a, 11b, 11c extends between a positive power rail or a positive DC voltage connection ("+") 12 of the converter 8 and a negative power rail or a negative DC voltage connection ("−") 13. It is understood that the converter 8 can, depending on the desired number of phases, also comprise only one phase branch 11, two phase branches or even more than three phase branches.

As further shown in FIG. 1, each converter branch 9a-f comprises here a series connection of a plurality of converter submodules 14. The controllable direct voltage $U_{dc}$ at the DC voltage connections 12, 13 of the converter 8 can be dynamically changed via the switching states of the individual converter submodules 14. The number of converter submodules 14 thereby determines the available number of converter switching states, which allow a fine voltage grading and a voltage form of high quality as well as high voltage levels up to the range of the high-voltage direct current (HVDC) transmission. The converter 8 is a modular multilevel or multi-point converter. An exemplary submodule 14 is explained in more detail below in connection with FIG. 2.

Circuit current limiting inductances 16 can be provided in the converter branches 9a-f, each supporting a decoupling of the converter branches from each other. At the connection point between the associated converter branches 9a, 9b or 9c, 9d or 9e, 9f the respective AC voltage connections 17a, 17b, 17c of the converter 8 are led out, which are connected to the AC voltage source 2. The direct voltage side connections of the first most upper submodules 14 of the converter 8 are connected with each other and with the positive power rail 12. Similarly, the direct voltage side connections of the last, lowest submodules 14 are connected with each other and with the negative power rail 13. Between the power rails 12, 13 the direct voltage $U_{dc}$ is present, which can be a high voltage, for example, over 100 kV.

Figure 2:
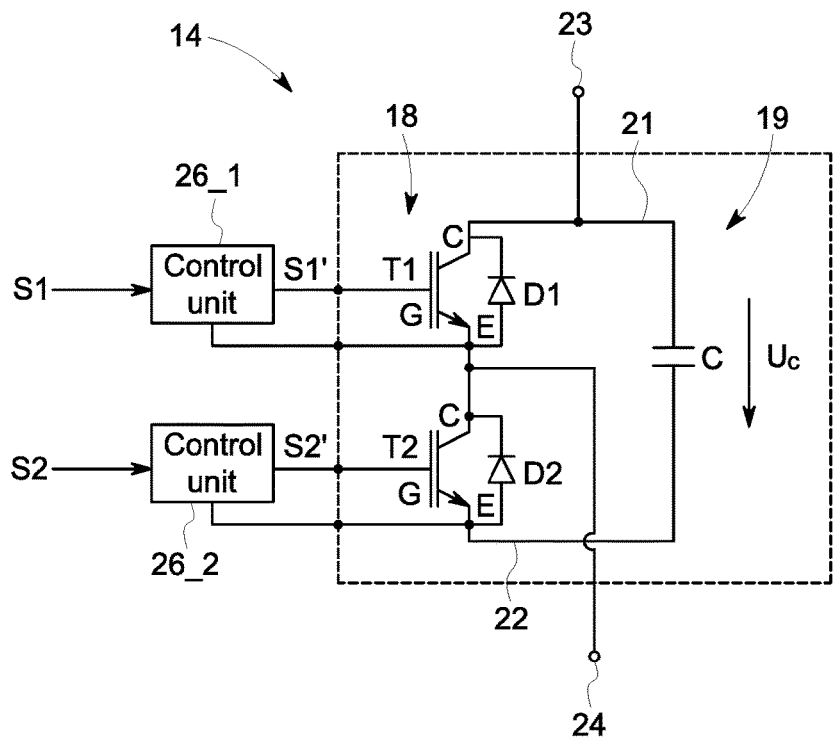
FIG. 2 shows a simplified circuit diagram of a converter submodule with a half bridge topology, which can be used in the modular multilevel converter according to FIG. 1, with associated control devices.

FIG. 2 shows in the form of a simplified circuit diagram a topology of a half bridge submodule 14, as it can be in use in the modular multilevel converter 8 according to FIG. 1. It should be noted that instead of the half bridge submodule 14 also other submodules known in the art on the basis of full or H bridges, mixed cells, asymmetric cells and the like can be used.

Referring to FIG. 2, the submodule 14 comprises a half bridge circuit 18 and a capacitor C, 19 connected in parallel to the bridge circuit 18. The half bridge circuit 18 is formed from a first power semiconductor switch T1 connected in series, to which an antiparallel or oppositely parallel connected freewheeling diode D1 is assigned, and a second power semiconductor switches T2 to which an antiparallel freewheeling diode D2 is assigned. The power semiconductor switches T1, T2 are connected in series between a first and a second DC voltage node or pole connection 21, 22, whereby the freewheeling diodes D1 and D2 are aligned in the direction of flow from the second, in FIG. 2 lower pole connection 22 to the first upper pole connection 21 of the submodule 14. Further, each diode D1, D2 is connected with its anode to the emitter of the respective power semiconductor switch T1 or T2, which is formed here as an IGBT, while the cathode is connected with the respective collector of the associated IGBTs T1 or T2.

The capacitor C, 19 as energy storage of the first submodule 14 is connected between the pole connections 21, 22. It can be a unipolar capacitor that serves as a DC voltage intermediate circuit capacitor of the submodule 14. In other converter topologies, the capacitor C can also be omitted.

The power semiconductor switches T1, T2 are controllable switches which are formed here by IGBTs. In principle also other voltage-controlled transistors that can be switched off can be used, such as field effect transistors, MOSFETs in particular, or gate turn-off thyristors (GTOs) and other similar electronic components, where the size of the control voltage can influence the resulting forward voltage of the power semiconductor switch in the conductive operation. A person skilled in the art will readily be able to transfer the statements that concern specific connections of IGBTS to corresponding connections of other power semiconductor types.

The first pole connection 21 forms a first submodule connection 23, while the connection point between the power semiconductor switches T1, T2 or the freewheeling diodes D1, D2 builds a second submodule connection 24. The submodules 14 in the converter 8 according to FIG. 1 can be connected in series with each other via submodule connections 23, 24.

Depending on the switching states of the power semiconductor switches T1, T2, it can be optionally made possible that the voltage between the first and the second submodule connection 23, 24 is zero or equal to the voltage $U_C$ of the storage capacitor C, 19 and that the storage capacitor C, 19 can emit or absorb energy. If both switches T1, T2 are switched off, the capacitor can emit no energy C, 19, which can be used favorably in case of an external fault, for example a load short circuit.

As further shown in FIG. 2, a control unit 26_1 or 26_2 is associated with every power semiconductor switch T1, T2, which serves to apply appropriate control voltage to the control electrode, the gate, of the respective power semiconductor switch T1, T2 in order to switch it on or off. The power semiconductor switches T1, T2 are conductive in the switched on state, so that a current can flow between the collector C and the emitter E of the respective IGBTs T1 or T2. The control units 26_1 or 26_2 generate the control signals S'1 or S'2 for the power semiconductor switches T1 and T2, depending on the respective control signals S1 or S2, which the control units receive from a higher-level control device. The control device is not shown in detail in FIG. 2, is however displayed in FIG. 1 and indicated with reference sign 27.

Again referring to FIG. 1, the control device 27 is provided to appropriately control the operation of the converter 8 based on the present operating conditions. For the sake of clarity, the control paths in FIG. 1 are indicated by dashed arrows 28, which emerge from the control device 27. On the basis of the control signals S, the control devices 26 appropriately control the associated power semiconductor switches T of the submodules 14 of all branches 9a-f to generate from the grid voltage $u_N(t)$ or its transformed voltages at the AC voltage connections 17a-c the desired DC voltage $U_{dc}$ between the DC voltage connections 12, 13 of the converter 8 or vice versa. The control or switching signals S, which are suitable for this, are determined by the control device 27 depending on the current operating conditions or parameters, which are continuously measured or determined in operation by a monitoring device not shown here. Measuring paths are indicated by dashed arrows 29 in FIG. 1, which enter in the control device 27. For example, the phase voltages and/or the phase currents at the AC voltage connections 17a-c, branch currents in the converter branches 9a-f and/or the DC link current in the DC voltage intermediate circuit, potentials at the DC voltage connections 12, 13 for the detection of the DC voltage intermediate circuit voltage $U_{dc}$ and/or other values can be detected or measured directly. Some values can be determined from directly detected values with well-known relations for electrical currents and voltages.

The multiplicity of power semiconductor switches T in the converter 8 can generate during operation substantial losses, including switching losses and conduction losses, which can cause high energy losses and additional operating costs of the converter. In this respect, it is important to minimize the losses of individual power semiconductor switches T in order to significantly reduce total losses. This is achieved by the control of the power semiconductor switches T.

Figure 3:
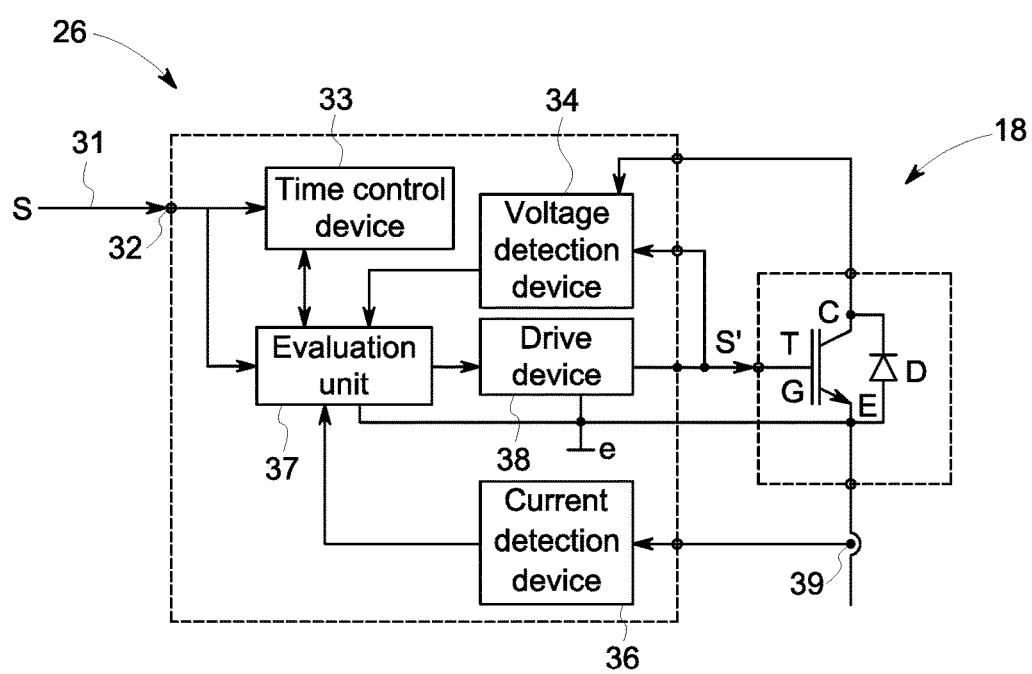
FIG. 3 shows a power semiconductor switch of the submodule according to FIG. 2 with associated control device in greater detail, in the form of a simplified block diagram.

FIG. 3 shows a power semiconductor switch T with an associated control device 26 in a greater level of detail. As shown in FIG. 3, the control device 26 can be arranged in the immediate vicinity of the associated power semiconductor switch T, for example, on the same printed circuit board, on a common mounting frame or in some other way close thereto. In order to receive the switch commands or control signals S from the higher-level control device 27, which can be further remote from the control device 26 or can also be an external control, the control device 26 comprises an input connector 32 which can be connected to the control device 27 via a control line 28.

As shown in FIG. 3, the control unit in the illustrated embodiment comprises a time control device 33, a voltage detection device 34 and a current detection device 36. Although the devices 33-36 are all shown to be present in the control device 26, not all devices 33-36 need to be provided together. In principle, one of the devices 33, 34 and 36 is sufficient to implement the control method according to an embodiment. In any case, the control device 26 further comprises an evaluation unit 37, which is configured to evaluate signals received from the devices 33, 34 or 36, and a drive device 38, which is configured to generate a suitable control signal S', which is applied to the gate connection G of the power semiconductor switch T.

The time control device 33 is used to detect the period of time since the receipt of a switch command S from the control device 27 or since the application of a control voltage S' to the gate connection G of the power semiconductor switch T and to supply a signal indicative of the period of time to the evaluation device 37.

The voltage detection device is used to detect voltage potentials at the collector connection C and/or the gate connection G of the power semiconductor switch T opposite the emitter connection E or the internal emitter potential e of the drive circuit, whose potential is used as the reference potential for the voltage measurements and to transmit voltage measurement signals indicative thereof to the evaluation device. The voltage detection can be performed directly at the respective connection, for example by means of a voltage divider. Alternatively, some voltages may be indirectly determined from other measured parameters in the circuit.

The current detection device 36 is configured to detect the load current through the power semiconductor switch T, which is the collector current $I_C$ here, which is equal to the emitter current $I_E$. A current sensor 39 is provided for current detection at the emitter connection E of the power semiconductor switch T. The current detection can also be determined by knowing the value of the parasitic inductance between the auxiliary and main emitter connection of the semiconductor power switch by integrating the voltage or with a voltage measurement on a shunt resistor. The current detection device 36 sends a current signal that is indicative of the load or collector current $I_C$ to the evaluation device 37.

The evaluation device 37 receives the measurement signals detected by the time control device 33, the voltage detection device 34 and the current detection device 37, as well as the ON and OFF switch commands S and evaluates these signals to instruct the drive device 38 to generate the respectively required control signals S'.

In particular, the evaluation device 37 is configured as a function of an ON switch command S from the control device 27 to cause the drive device 38 to switch on the power semiconductor switch T, and as a function of an OFF switch command S from the control device 27 to cause the drive device 38 to switch off the power semiconductor switch T. The evaluation device 37 is further configured to recognize conditions, which are indicative of the fact that the switch-on procedure is deemed to be complete by means of the signals provided by the time control device 33, the voltage detection device 34 and the current detection device 36. In this case, the evaluation device 37 transmits a corresponding evaluation signal to the drive device 38, which causes it to apply a suitable control voltage for the conductive state of the power semiconductor switch T to the control connection of the power semiconductor switch T.

During the switch-on of the power semiconductor T, a first control voltage is applied, which comprises a first value, while after detection that the power semiconductor T is fully switched on or switched through, a second control voltage comprising a second value, which is higher than the first value, is applied to the control connection G. In other words, the power semiconductor switch T is controlled in the conductive state with a higher control voltage. The logic of the evaluation device 37 is explained in more detail below in conjunction with FIG. 6.

The drive device 38 receives evaluation signals from the evaluation device 37 and, depending on those signals, generates the respective suitable control signals S' for the power semiconductor switch T in order to appropriately switch it on, switch it off and operate it in the switched on state. The drive device 38 must thus be able to generate at least two different positive levels of the control voltage S' for the power semiconductor switch T. An exemplary drive device 38 capable of doing so is illustrated in FIG. 4.

Figure 4:
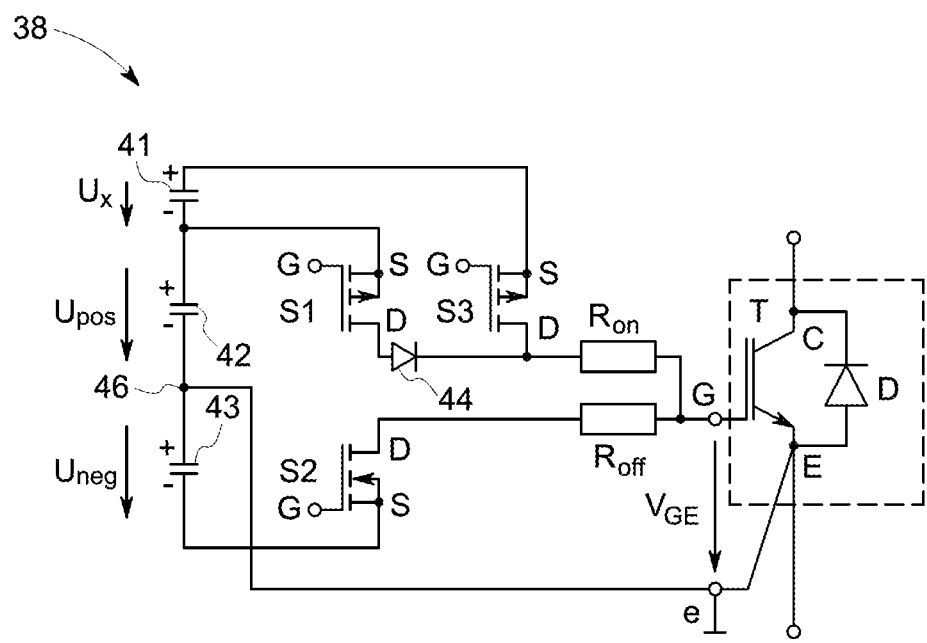
FIG. 4 shows a simplified circuit diagram of a drive device for use in the control unit according to FIG. 3.

Referring to FIG. 4, the illustrated exemplary drive device 38 comprises a first, a second and a third voltage source 41, 42, 43, which are connected in series with one another with the same polarity. The first voltage source 41 is a positive voltage source, which may be, but does not necessarily have to be, a variable voltage source, which can supply different positive voltage values depending on an operating mode. A constant voltage source 41 with a fixed voltage value $U_x$ can also be provided.

The second voltage source 42 ($U_{pos}$) and the third voltage source 43 ($U_{neg}$) are constant voltage sources, which can comprise the same or different voltage values. For example, $U_{pos}$ can be about 10-15 V, while $U_{neg}$ can be about $-5$ V to $-15$ V. $U_{pos}$ or $U_{neg}$ determine the control voltages which are applied to the gate connection when the power semiconductor switch T is switched on or off.

The positive pole of the second voltage source 42 is connected via a first switch S1, which is formed here by a p-channel MOSFET, a diode 44 and a switch-on resistor $R_{on}$ to the gate connection G of the power semiconductor switch T. The diode 44 is connected in the flow direction from the drain connection D of the switch S1 in the direction of the gate connection G of the power semiconductor switch T to the switching-on resistor $R_{on}$.

The negative pole of the third voltage source 43 $U_{neg}$ is connected via a second switch S2 in the form of a p-channel MOSFET with a switch-off resistor $R_{off}$, which is connected on the one hand to the drain connection D of the second switch S2 and, on the other hand, to the gate connection G of the power semiconductor switch T. The switch-on and switch-off resistors $R_{on}$ and $R_{off}$ can be suitably selected to optimize the switching operations. The switching operations are explained in more detail below in connection with FIG. 5.

As further shown in FIG. 4, the connection point 46 between the second and the third voltage source 42, 43 is connected to the emitter E of the power semiconductor switch T and serves as a local reference point e for the control circuit as well as for the drive device 38. The emitter E of the power semiconductor switch T and the local reference point e can also be decoupled by an additional resistor for the switching operation.

The positive pole of the first voltage source 41 is connected to the connection point between the cathode of the diode 44 and the switch-on resistor $R_{on}$ via a third switch S3, which is formed by a p-channel MOSFET.

When the first switch S1 is switched on, while the second and third switches S2, S3 are off, the voltage $U_{pos}$ of the second voltage source 42 is applied to the gate connection G of the power semiconductor switch T via the diode 44 and the switch-on resistor $R_{on}$ to switch on the power semiconductor switch T. When the second switch S2 is switched on while both switches S1 and S3 are switched off, the negative voltage $-U_{neg}$ of the third voltage source 43 is applied to the gate connection G of the power semiconductor switch T via the switch S2 and the switch-off resistor $R_{off}$ to switch it off. If the third switch S3 is switched on, while at least the switch S2 is switched off (switch S1 can also remain switched on), the sum voltage $U_x + U_{pos}$ of the first and second voltage sources 41, 42 is applied to the gate connection G of the power semiconductor switch T via the switch S3 and the switch-on resistor $R_{on}$. This occurs according to an embodiment, as soon as conditions are detected which are indicative of the fact that the switch-on procedure is deemed to be complete, thus the power semiconductor switch T is switched through.

Figure 5:
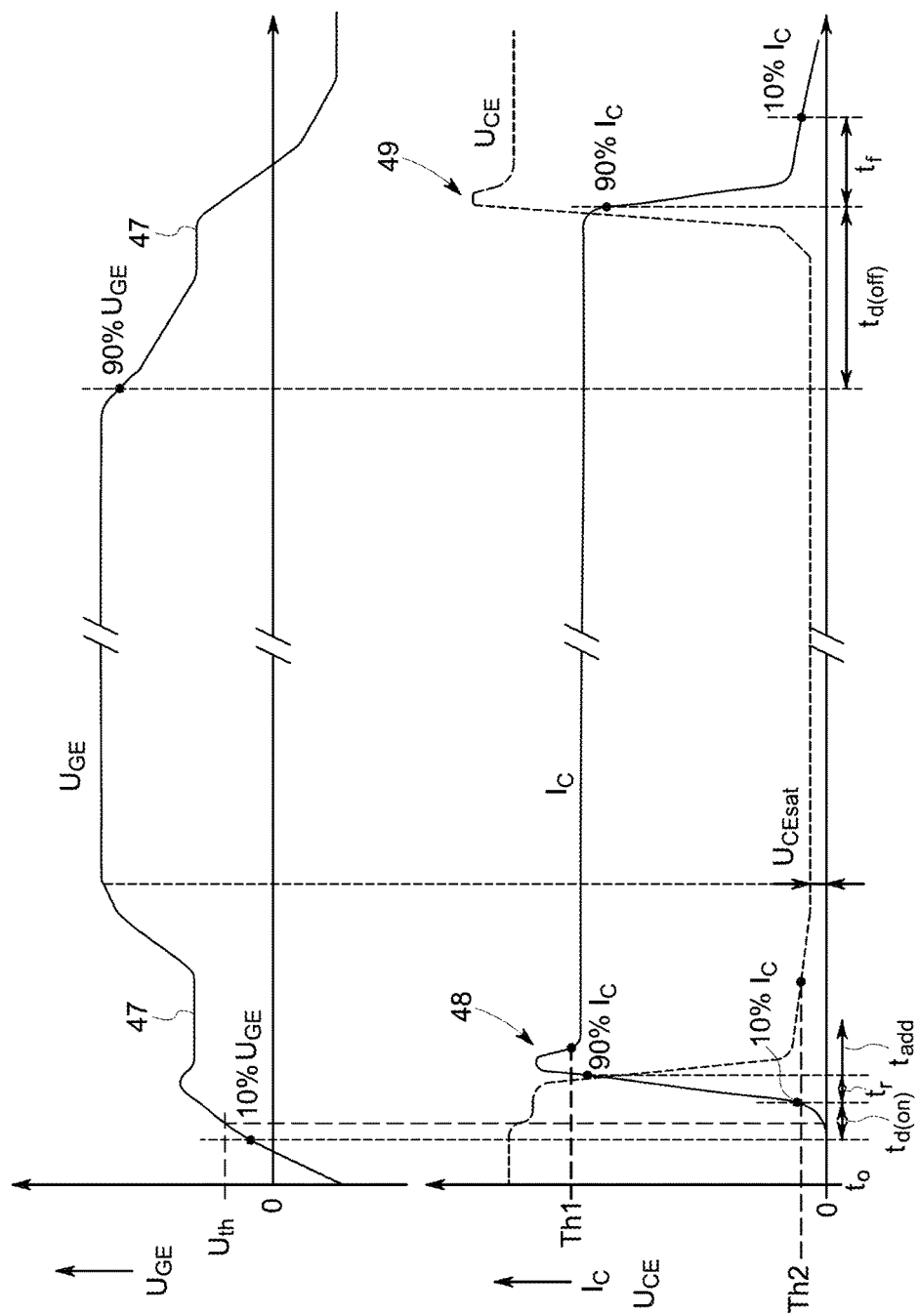
FIG. 5 shows a graphical representation of voltage and current curves for a power semiconductor switch for the definition of switching times.

To illustrate the functioning of the control device 26 according to an embodiment, reference is initially made to FIG. 5, the temporal courses of the gate emitter voltage $U_{GE}$, the collector emitter voltage $U_{CE}$ and the collector current $I_C$, when switching-on, switching-off and during the conductive state of an IGBT. The statements similarly apply to a MOSFET. When at the time $t_0$, the IGBT is switched on by applying a gate voltage $U_G$, the gate emitter voltage $U_{GE}$ initially rises slightly delayed, becomes positive, reaches 10% of its value and then the so-called threshold voltage $U_{th}$, at which the IGBT begins to conduct current. The collector emitter voltage $U_{CE}$ shows a reduction of the voltage by the fraction falling at the commutation circuit inductance. The collector current $I_C$ correspondingly only starts to rise after a switch-on delay $t_{d(on)}$. The switch-on delay $t_{d(on)}$ is defined between the time, when the gate emitter voltage in the case of an IGBT (or the gate source voltage in the case of a MOSFET) is approximately 10% and the time, in which the collector current $I_C$ (or drain current $I_D$) is about 10% of its stationary nominal value.

The gate emitter voltage $U_{GE}$ does not rise directly to the applied end value, but first reaches the so-called "Miller plateau" 47, on which the gate emitter voltage remains firstly constant. Up to this moment the current in the IGBT rises. Upon reaching the Miller plateau, the commutating diode begins to absorb voltage, thereby dropping the collector emitter voltage of the IGBT. At this time, the so-called reverse recovery effect occurs at the commutating diode, which can be observed as current or reverse current peak 48 on the collector current of the IGBT. The charge carriers, which flow into the gate electrode, are used during this period of time for charge reversal of the gate-collector capacitance of the IGBT (or gate-drain capacitance of the MOSFET). During the Miller plateau 47, the collector emitter voltage $U_{CE}$ drops initially with a first, high rate of change of the collector emitter voltage $dU_{ce}/dt$ and subsequently with a lower $dU_{ce}/dt$ value until it reaches its final value $U_{CEsat}$, in which the power semiconductor switch is completely switched on or switched through.

The period of time from the moment at which the collector current is 10% of the nominal current to the moment at which it is 90% of the nominal current is designated as the rise time $t_r$. After the charge reversal or the end of the Miller plateau, the gate emitter voltage $U_{GE}$ increases to the final value, which has been applied by the gate drive, e.g. the drive device 38. Upon reaching the final value of the gate emitter voltage, the component is fully switched on and the collector emitter voltage has reached $U_{CEsat}$.

When switching off, the gate emitter voltage $U_{GE}$ drops analogously initially to the Miller plateau 47 on which it remains for a short time before it drops to the applied value, usually a negative value of −5 to −15 V. The voltage $U_{CE}$ rises and passes through a switch-off overvoltage 49, which depends on the applied gate emitter voltage $U_{GE}$ and the rate of change of the collector current $dI_C/dt$ and the commutation circuit inductance. The collector current $I_C$ correspondingly only starts to fall after the switch-off after a switching-off delay $t_{d(off)}$. The period of time from the moment at which the collector current $I_C$ is 90% of the nominal current to the moment at which it is 10% of the nominal current is designated as the fall time $t_f$. The switch-on delay $t_{d(on)}$, the rise time $t_r$, the rate of change of the collector current, the switch-off delay $t_{d(off)}$, the fall time $t_f$, the fall rate, etc., as shown in FIG. 5, are characteristic for a particular power semiconductor type and are specified in associated data sheets or can be determined by measurement on the converter or converter components for corresponding switching conditions. Factors such as temperature, current, voltage and gate drive have an influence on these times.

Many methods have been proposed in the art to optimize the switching transients by multi-stage switch-on, optimized gate current profiles or gate voltage curves, designing of switch-on and switch-off resistors and control of the rate of change of the collector emitter voltage and/or rate of change of the collector current of an IGBT during the switching operation, in order to minimize, among other things, the switching losses. All these methods are aimed at the optimization of the switching behavior or the switching operations. Embodiments of the invention, however, aim at optimizing the conductive operation of a power semiconductor switch to minimize conduction losses. This is described in more detail with reference to FIG. 6.

Figure 6:
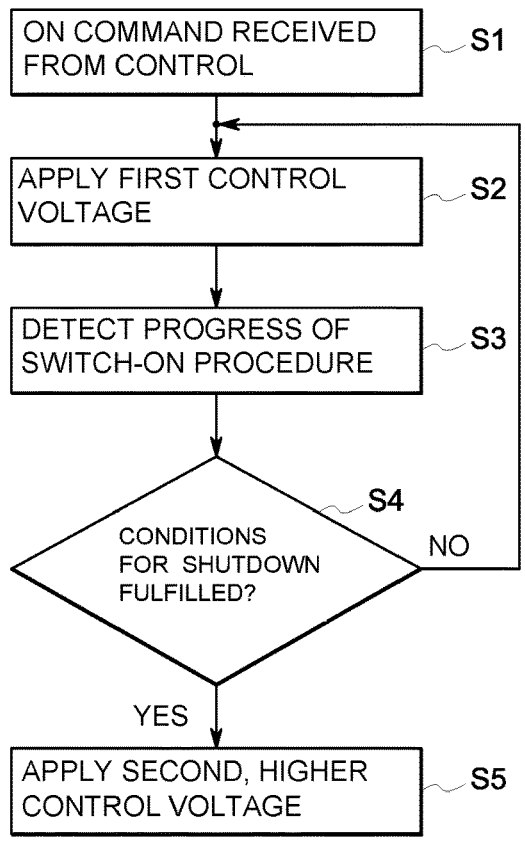
FIG. 6 shows a flowchart of a method controlling a power semiconductor switch, in a simplified representation.

FIG. 6 shows a method for controlling a voltage-controlled power semiconductor switch that can be switched off again according to embodiments of the invention, such as the power semiconductor switches T, T1, T2 represented in the FIGS. 2-4, which particularly can be IGBTs or MOSFETs or other voltage controlled power semiconductor switches, which can be switched off again, which can by applying a control voltage to their control connection, gate connection, be switched on and switched off, whereby in the switched on state they can conduct a current, particularly a collector current between a first and a second connection, e.g. the collector and the emitter.

The process begins in step S1, where a control signal, in particular an ON switch command S from a higher-level control, in particular the control device 27, is received. The ON switch command is received, for example, by the time control device 33 and the evaluation device 27 represented in FIG. 3. The evaluation device 37 can then essentially cause the drive device 38 to switch on the power semiconductor switch T immediately.

For the switch-on of the power semiconductor switch T, as shown in step S2 in FIG. 6, a first control voltage, particularly gate voltage, which comprises a first value, is applied to the control connection (gate) of the power semiconductor switch T. The first value can be, for example, 10 V-15 V. By applying the control voltage, the power semiconductor switch T is switched in a matter described in conjunction with FIG. 5.

The evaluation device 37 can also instruct the drive device 38 to switch on the power semiconductor switch T with a set delay. In this case, the evaluation device alerts the time control device of the time, at which the first control voltage is applied to the control connection of the power semiconductor switch. The time control device 33 begins then the timing with this event of applying the first control voltage.

In step S3 conditions are detected that indicate the progress of the switch-on procedure of the power semiconductor switch. For example, the time control device 33 detects the period of time since the first control voltage is applied. Alternatively or additionally, the voltage detection device 34 can measure or determine the current value of the collector emitter voltage $U_{CE}$ or the gate emitter voltage $U_{GE}$. As another alternative or further in addition can the load current through the power semiconductor switch, i.e. the collector current $I_C$, be measured or determined using the current detection device 36. The signal(s) from the time control device 33, the voltage detection device 34 or the current detection device 36 are fed to the evaluation device 37 for monitoring.

In step S4 it is checked whether conditions exist, which are indicative of the fact that the switch-on procedure is deemed to be complete. This can be done in various ways.

In one embodiment, for example, the signal can be evaluated by the current detection device 36, which marks the current of the power semiconductor switch, thus, for example, the collector current $I_C$. If the current $I_C$ has run through a reverse current peak that corresponds to the commuting diode associated to it, as for example, the current peak 48 in FIG. 5, and if it dropped back again to a first threshold value Th1, where the rate of change of the collector current $dI_C/dt$ is in the amount less than 20%, less than 10% of the current increase from 10% to 90% of the current $I_C$ when switching-on the power semiconductor switch T (period of time $t_r$ in FIG. 5), the power semiconductor switch T can be viewed as completely switched on. Then, the higher, second control voltage can be applied.

The embodiments based on an evaluation of the collector current can be very effective, but can be relatively complex to implement because of the required collector current detection.

In other, more preferred embodiments, the measured forward voltage of the power semiconductor switch, for example, the collector emitter voltage $U_{CE}$, is used to check whether the switch-on procedure is deemed to be complete. If the forward voltage reaches or falls below a second threshold value Th2, which is indicative of the fact that the power semiconductor switch is switched on, it will be proceeded to step S5.

The second threshold value Th2 can be determined in dependency of the maximum possible forward voltage on the power semiconductor switch in conductive state. The maximum possible forward voltage for the regular operation can be determined by measurements. Taking into account measurement uncertainties of the device, the time response and the dispersion of the semiconductor devices, the second threshold value Th2 can be chosen. Influencing factors can be here the dependence of the switching behavior on the control voltage, the gate resistors, the dispersion or commutation circuit inductance of the circuit, the thermal conditions in the operation, and others. The second threshold value Th2 can be in the range from 10 V to 0.5 V, it is less than 5 V.

In still further embodiments, the voltage at the control electrode, e.g. the gate voltage, can be used for detection of conditions, which are indicative of the fact that the switch-on procedure is deemed to be complete. If the voltage at the control electrode reaches or exceeds a third threshold value Th3, which is higher than a value of the Miller plateau of the control voltage, for example, of the Miller plateau 47 in FIG. 5, the above condition can be considered fulfilled. The third threshold value can be at least 90% of the value of the applied first control voltage. In an embodiment, it can be more than 95% of the value of the first control voltage.

In particularly preferred embodiments, the period of time since the moment of the application of the first control voltage is detected and used to check the condition, which is indicative of the fact that the switch-on procedure is deemed to be complete. If the period of time exceeds the specified time threshold value $t_{th} = r_{td(on)} + t_r + t_{add}$, the above condition can be considered fulfilled. Thereby, $t_{d(on)}$ is the switch-on delay, as shown in FIG. 5, while $t_r$ is the rise time of the current, for example, collector current, of the power semiconductor switch. These parameters are specified in the data sheets for the respective power semiconductor types or can be determined by measurement on the converter or converter components. $t_{add}$ is an additional time constant, which creates a safety margin and which can take into account the gate drive behavior dependent period of time between the application of the gate voltage and the time of reaching 10% of the collector current $I_C$ and also possible short-circuit measures or checks, which can be active during and shortly after the switch-on procedure. As shown in FIG. 5, with the additional time constant $t_{add}$, the time when the condition is considered fulfilled, can be placed in the area of the increase of the gate emitter voltage from the Miller plateau 47 to a stationary value or in the range after the current peak 48. The time constant $t_{add}$ can be, for example, 0 to 20 μs., it is between 5 and 15 μs.

As long as in step S4 in FIG. 6 it is detected that the condition of the switched on power semiconductor switches is not fulfilled (no), the process returns to step S2, whereby the first control voltage remains applied.

As soon as it is detected in step S4 that the condition of the switched on power semiconductor switches is met (yes), the method proceeds to step S5. In step S5, a second control voltage, which has a second value, which is higher than the first value, is applied to the control connection of the power semiconductor switch to operate it in conductive state.

For example, the second control voltage can be in the range from 15 V and 20 V. In particular, if the first control voltage is 15 V, it can be 17 V.

Figure 7:
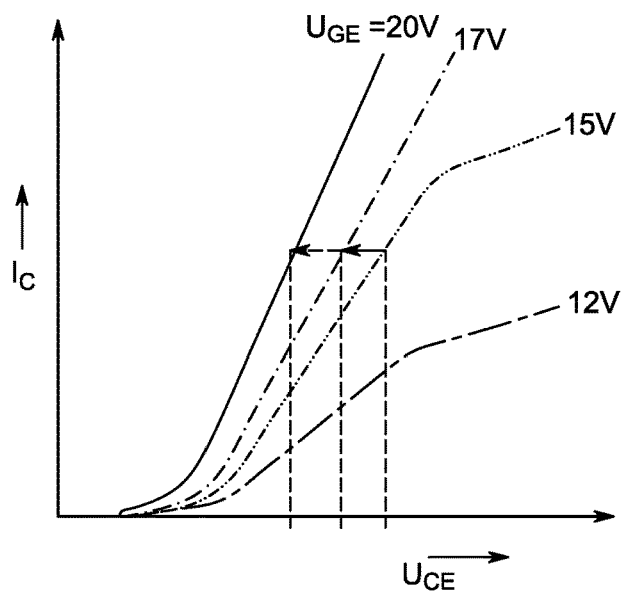
FIG. 7 shows an output characteristic of a power semiconductor switch in the form of an IGBT for various control voltages, in a simplified representation.

FIG. 7 illustrates the output characteristic for a power semiconductor switch, in particular an IGBT, for various gate emitter voltages $U_{GE}$ of 12 V, 15 V, 17 V and 20 V. The collector current $I_C$ is represented above the collector emitter voltage $U_{CE}$, whereby the saturation areas in this representation are essentially of interest. With increasing gate emitter voltage $U_{GE}$, the saturation current or saturation range of collector current $I_C$ increases in comparison to the voltage $U_{CE}$. If now the gate emitter voltage $U_{GE}$ is increased in the conductive, switched through state of the power semiconductor switch, for example, from 15 V to 17 V, the voltage saturation range is increased, and the forward voltage $U_{CE}$ of the power semiconductor switch decreases. As a result, the power semiconductor switch has lower conductive losses in the conductive operation. The channel resistance of the power semiconductor switch sinks and also the junction temperature of the power semiconductor switch decreases with given collector current. Thus, measures that are necessary for the cooling of the power semiconductor switch, can be reduced, with resultant cost reductions for the implementation. Also, the power semiconductors can handle better momentary overload conditions and in comparison to an operation with a lower gate emitter voltage, it does not have to be strongly oversized. The reduced conduction losses, dimensioning and space requirements may have a particularly advantageous effect on converters, such as the converter according to FIG. 1, or other converters or devices that use a multiplicity of power semiconductor switches in the pulse mode.

In embodiments, a higher control voltage $U_{GE}$ than 17 V, for example 20 V, is chosen. If desired, the control voltage can be even higher than the parameter specified for continuous operation of IGBTs and MOSFETs. For example, the control voltage can be more than 20 V or even more than 30 V.

Numerous modifications are possible within the scope of the present invention. For example, the device and the method according to an embodiment for the control of power semiconductor switches are not only suitable in modular power converters, as illustrated, but are also suitable in any converter topologies, even in conventional 2-level and 3-level power converters and in other applications. Also, numerous drive circuits are known or state of the art, which are able to apply the necessary multistage control voltage to the control electrode of a power semiconductor switch.

In a further development of the method after the detection of conditions, for example, time or current conditions, which are indicative of the fact that the switch-on procedure is deemed to be complete, it can first be checked whether the forward voltage $U_{CE}$ or the collector current $I_C$ exceed a preset fourth threshold value. The fourth threshold value for the forward voltage $U_{CE}$ can be larger than the second threshold value and be, for example, 5-10 V. The fourth threshold value for the collector current $I_C$ can be a value, for example, above the nominal current of the semiconductor device. A presence of such a high forward voltage $U_{CE}$ or such a high collector current indicates then an overload condition, whereby the second control voltage is applied only if overload conditions are found to exist. Short time overloads or other critical situations can then be handled better and accompanying losses reduced.

Further, the switch-off of the power semiconductor switch can also occur in two steps, by first applying to the control connection, e.g. the gate connection G, a first control voltage, which is less than the second control voltage in the conductive operation and corresponds roughly to the first control voltage, while after expiry of a predetermined period of time a voltage, in particular a negative voltage in the range of −5 V to −15 V, is applied, which is appropriate to a safe switch-off of the power semiconductor switch.

Figure 8A:
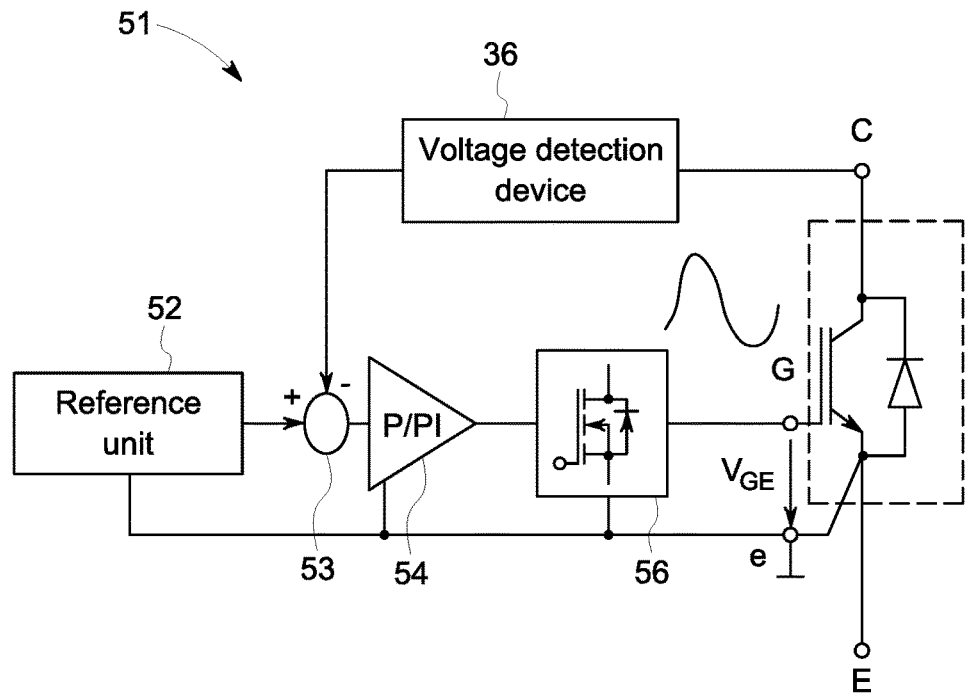
FIGS. 8a and 8b show circuit diagrams of a regulating device for use in the control device according to further embodiments, in a simplified representation.
Figure 8B:
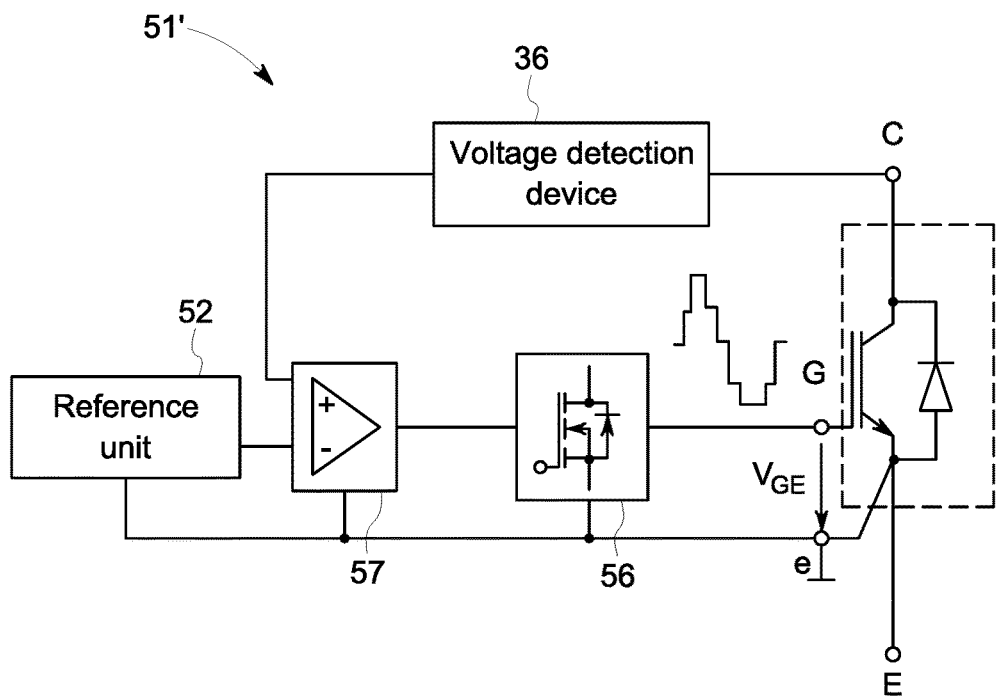

A further modification is illustrated in FIGS. 8a and 8b. Here, the voltage, which is applied to the control electrode G of the power semiconductor switch T, is regulated to the second value of the control voltage during the conductive state of power semiconductor switch T in a closed control loop of a regulating device. The regulating device 51 in FIG. 8A comprises the voltage detection device 36, which detects the forward voltage $U_{CE}$ of the power semiconductor switch T. A reference unit 52 provides the target value or the reference variable for the forward voltage. An adder 53 determines the control deviation or the difference between the target value and the actual value of the forward voltage $U_{CE}$ and provides the control deviation to a regulator 54. The regulator 54 can be a proportional (P) or a proportional-integral (PI) regulator. The output of the regulator 54 provides the general regulating variable to a multistage amplifier 56, which creates the correspondingly increased gate emitter voltage as an actuator and applies it to the gate connection G of the power semiconductor switch. Also a variable current source or voltage source can be used instead of the multistage amplifier.

The regulating device 51' represented in FIG. 8b differs from that in FIG. 8a primarily only by the fact that here the adder 53 and the PI regulator 54 are replaced by a comparator 57, which compares the target value and the actual value of the forward voltage $U_{CE}$ and delivers at its output a positive or a negative signal (or a zero signal), depending on whether the target value is greater or less than the actual value. Depending on the result of the comparison of the comparator 57, the multistage amplifier 56 puts then the control voltage for the gate connection G of the power semiconductor switch T one level up or down.

In this way, the forward voltage $U_{CE}$ can be adjusted to the desired value within certain limits of the output characteristic of the power semiconductor and in a controlled manner. Too high rates of change of the collector current due to one-stage switching during the switching operations can be avoided. The control can be implemented analogously or digitally. The load current $I_C$ can be used instead of the forward voltage $U_{CE}$ as measuring and/or regulating variable.

In addition, the control device 26 according to an embodiment can be implemented in analog or digital form. A digital implementation can be carried out on the basis of an FPGA or a microcomputer. The algorithm with the control method according to an embodiment, as described in more detail in connection with FIG. 6, may be embodied in the form of computer-executable instructions, which may be distributed and used in the form of a computer program product comprising a computer-readable medium that stores these instructions. As an example, a computer-readable medium may include computer storage media and communication media. As is known to those skilled in the art, computer storage media include both volatile and non-volatile, interchangeable and non-removable media, which are implemented by any method and in any technology for storing information, such as computer readable information, data structures, program modules or other data. Computer storage media include, but are not limited to, RAM, ROM, EEPROM, flash memory or other storage technologies, CD-ROM, DVD or optical disk storage, magnetic cassettes, magnetic tapes and other magnetic storage devices. Further, it is known to those skilled in the art that communication media typically embody computer-readable instructions, data structures, program modules or other data in the form of a modulated data signal, e.g. a modulated carrier wave or other transport mechanism, and may include any information transmission media.

A method and a device for controlling an IGBT or a MOSFET or other voltage-controlled power semiconductor switch T that can be switched off again, which has a first and a second connection C, E as well as a control connection G, and which is conductive in the switched on state between the first and the second connection C, E, is provided. Firstly, a first control voltage comprising a first value is applied to the control connection G to switch on the power semiconductor switch T, S2. Subsequently, conditions are detected, which indicate the progress of the switch-on procedure of the power semiconductor switch T, S3. As soon as conditions are detected, which are indicative of the fact that the switch-on procedure is deemed to be complete, S4, a second control voltage comprising a second value higher than the first value is applied to the control connection G to operate the power semiconductor switch T in the conductive state with a higher control voltage S5 to reduce its conduction losses.

What is claimed is:

1. A method for controlling a voltage-controlled power semiconductor switch that can be controlled to a switched-on state and a switched-off state, the power semiconductor switch comprising a first and a second connection and a control connection, wherein the power semiconductor switch is conductive in the switched-on state between the first and the second connection, the method comprising:
   applying a first control voltage comprising a first value to the control connection to switch on the power semiconductor switch;
   detecting conditions, which indicate the progress of the switch-on procedure of the power semiconductor switch; and
   applying a second control voltage comprising a second value higher than said first value to said control connection to operate the power semiconductor switch in the conductive state when conditions are detected, which are indicative that the switch-on procedure is deemed to be complete.

2. The method according to claim 1, wherein the application of the first control voltage takes place in response to the receipt of a control signal from a higher-level control device.

3. The method according to claim 1, wherein the detection of conditions, which indicate the progress of the switch-on procedure of the power semiconductor switch, comprises a detection of at least one operating parameter at the power semiconductor switch, comprising at least one voltage potential at one of the connections of the power semiconductor switch and/or the load current through the power semiconductor switch, and/or a detection of the period of time since the application of the first control voltage to the control connection.

4. The method according to claim 1, wherein the detection of conditions, which are indicative that the switch-on procedure is deemed to be complete, comprises that the expiry of a period of time $t_{th}=t_{d(on)}+t_r+t_{add}$ since the time of the application of the first control voltage is detected, wherein $t_{d(on)}$ is the switch-on delay and $t_r$ is the rise time of the current of the power semiconductor switch, as specified for the power semiconductor switch type, and $t_{add}$ is an additional time.

5. The method according to claim 1, wherein the detection of conditions, which are indicative that the switch-on procedure is deemed to be complete, comprises that a short circuit monitoring is complete, in which it is checked whether the power semiconductor is switched on directly upon a short circuit, wherein the second control voltage is applied when it is determined that there was no short circuit before the switch-on.

6. The method according to claim 1, wherein the detection of conditions, which are indicative that the switch-on procedure is deemed to be complete, comprises a detection that the voltage on the control connection reaches or exceeds a third threshold value, which is higher than a value of a Miller plateau of the first control voltage and at least 90% of the value of the first control voltage.

7. The method according to claim 1, wherein the detection of conditions, which are indicative that the switch-on procedure is deemed to be complete, comprises a detection that the forward voltage between the first and the second connection reaches or falls below a second threshold value, which is indicative that the power semiconductor switch is switched on.

8. The method according to claim 7, wherein the second threshold value is chosen in dependence of the forward voltage on the power semiconductor switch in the conductive state;
wherein the second threshold value is in the range of 10 volts to 0.5 volts.

9. The method according to claim 1, wherein the detection of conditions, which are indicative that the switch-on procedure is deemed to be complete, comprises a detection that the current flowing between the first and the second connection has passed through a current peak, which corresponds to the reverse current peak of a commutating diode belonging to the power semiconductor switch, and after passing through the reverse current peak has fallen below a first threshold value at which the rate of change of the current through the power semiconductor switch is less than 20% of the current rise from 10% to 90% of the current when switching on the power semiconductor switch.

10. The method according to claim 1, wherein the power semiconductor switch is an Integrated Gate Commutated Thyristor or a Metal Oxide Semiconductor Field Effect Transistor, the first control voltage is 10-15 volts, and the second control voltage is 15-20 volts.

11. The method according to claim 1, wherein the second control voltage is higher than the parameter specified for the continuous operation of the power semiconductor switch.

12. The method according to claim 1, wherein, after the detection of conditions, which are indicative that the switch-on procedure is deemed to be complete, it is checked whether overload conditions are present and the second control voltage is applied only if it is determined that overload conditions are present.

13. The method according to claim 1, wherein the voltage applied to the control connection of the power semiconductor switch is regulated to the second value of the second control voltage in a closed control loop, wherein the measured forward voltage and/or the measured load current of the power semiconductor switch forms the measured value for the feedback in the control loop.

14. The method according to claim 1, wherein a control voltage which is smaller than the second control voltage and is initially applied to the control connection for switching off the power semiconductor switch, and after expiry of a predetermined period of time a voltage suitable for the safe switch-off of the power semiconductor switch is applied.

15. A device for controlling a voltage-controlled power semiconductor switch that can be controlled to a switched-on state and a switched-off state, the power semiconductor switch comprising a first and a second connection and a control connection, wherein the power semiconductor switch is conductive in the switched-on state between the first and the second connection, wherein the device is configured to perform the method of claim 1.

16. The device according to claim 15, wherein the device comprises a drive device configured to receive ON and OFF control commands and to generate control voltages for the power semiconductor switch, the device further comprises a detection device for detection of at least one operating parameter on the power semiconductor switch, comprising at least one voltage potential at one of the connections of the power semiconductor switch and the load current through the power semiconductor switch, and/or a time control device for the detection of a period of time since the application of the first control voltage to the control connection.

17. The device according to claim 15, wherein the device comprises a regulating device for regulating the voltage applied to the control connection of the power semiconductor switch to the second value of the second control voltage in a closed control loop using the measured forward voltage or the measured load current of the power semiconductor switch serving as a measured value for the feedback in the control loop.

18. The device according to claim 15, where the device is assigned to a power converter with a multiplicity of power semiconductor switches to convert alternating current into direct current and vice versa.

19. Data storage device comprising computer readable instructions for executing a method, the method comprising:
applying a first control voltage comprising a first value to a control connection of a power semiconductor switch to switch on the power semiconductor switch, the power semiconductor switch including a first connection, a second connection, and the control connection, wherein when switched on the power semiconductor switch is in a conductive state between the first and second connections;

detecting conditions, which indicate the progress of the switch-on procedure of the power semiconductor switch; and applying a second control voltage comprising a second value higher than said first value to said control connection to operate the power semiconductor switch in the conductive state when conditions are detected, which are indicative that the switch-on procedure is deemed to be complete.

\* \* \* \* \*